US012369416B2

(12) United States Patent
Tung et al.

(10) Patent No.: US 12,369,416 B2
(45) Date of Patent: Jul. 22, 2025

(54) IMAGE SENSOR HAVING DISH STRUCTURE FORMED WITHIN MICRO-LENS

(71) Applicant: VisEra Technologies Company Limited, Hsin-Chu (TW)

(72) Inventors: Yao-Chung Tung, Hsin-Chu (TW); Zong-Ru Tu, Zhubei (TW); Chi-Han Lin, Zhubei (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 630 days.

(21) Appl. No.: 17/492,170

(22) Filed: Oct. 1, 2021

(65) Prior Publication Data

US 2023/0104190 A1    Apr. 6, 2023

(51) Int. Cl.
| | | |
|---|---|---|
| *H10F 39/00* | (2025.01) | |
| *G02B 3/14* | (2006.01) | |
| *G02B 13/00* | (2006.01) | |
| *G02B 13/18* | (2006.01) | |

(52) U.S. Cl.
CPC ........... *H10F 39/8063* (2025.01); *G02B 3/14* (2013.01); *G02B 13/002* (2013.01); *G02B 13/18* (2013.01); *H10F 39/8023* (2025.01); *H10F 39/8053* (2025.01); *H10F 39/8057* (2025.01); *H10F 39/807* (2025.01)

(58) Field of Classification Search
CPC ........... H01L 27/14627; H01L 2/14621; H01L 27/14623; H01L 27/14605; H01L 27/1463; G02B 3/14; G02B 13/002; G02B 13/18; H10F 39/8063; H10F 39/8023; H10F 39/8053; H10F 39/8057; H10F 39/807

See application file for complete search history.

(56) References Cited

U.S. PATENT DOCUMENTS

| | | | |
|---|---|---|---|
| 2009/0237801 A1 | 9/2009 | Liu | |
| 2009/0261440 A1* | 10/2009 | Kawasaki | G02B 3/0056 257/E31.127 |
| 2011/0279727 A1* | 11/2011 | Kusaka | H01L 27/14627 348/340 |
| 2012/0326011 A1* | 12/2012 | Ichimura | H01L 31/02327 257/E31.127 |
| 2013/0270665 A1* | 10/2013 | Sasaki | H01L 31/02325 257/432 |

(Continued)

FOREIGN PATENT DOCUMENTS

| | | |
|---|---|---|
| CN | 101561548 A | 10/2009 |
| CN | 102646689 A | 8/2012 |

(Continued)

OTHER PUBLICATIONS

An Office Action in corresponding TW application No. 111103802, mailed Oct. 5, 2022 is attached, 8 pages.

*Primary Examiner* — Jennifer D Bennett
(74) *Attorney, Agent, or Firm* — Muncy, Geissler, Olds & Lowe, P.C.

(57) ABSTRACT

An image sensor includes: a plurality of sensing portions; a color filter layer disposed on the sensing portions; and a micro-lens disposed on the color filter layer. The micro-lens includes a positive radius of curvature, and a dish structure including a negative radius of curvature is formed within the micro-lens.

20 Claims, 10 Drawing Sheets

(56) References Cited

U.S. PATENT DOCUMENTS

| | | | |
|---|---|---|---|
| 2014/0085517 A1* | 3/2014 | Lenchenkov | H01L 27/1464 |
| | | | 257/432 |
| 2016/0276394 A1* | 9/2016 | Chou | H01L 27/14636 |
| 2018/0301484 A1* | 10/2018 | Vaartstra | H01L 27/14621 |
| 2019/0267420 A1* | 8/2019 | Lee | H01L 27/14627 |
| 2020/0075652 A1* | 3/2020 | Chen | H01L 27/14645 |
| 2020/0328243 A1 | 10/2020 | Micinski et al. | |
| 2022/0037385 A1* | 2/2022 | Bang | H01L 27/1462 |

FOREIGN PATENT DOCUMENTS

| | | | |
|---|---|---|---|
| CN | 103545335 A | | 1/2014 |
| CN | 106164731 A | | 11/2016 |
| JP | 05129569 A | * | 5/1993 |
| JP | 08-316447 A | | 11/1996 |
| JP | 2006071941 A | | 3/2006 |
| JP | 2007305866 A | | 11/2007 |
| JP | 2009168872 A | | 7/2009 |
| JP | 2013004938 A | | 1/2013 |
| JP | 2016139988 A | | 8/2016 |
| TW | 200818477 | | 4/2008 |
| TW | 200818481 | | 4/2008 |
| TW | 200949297 | | 12/2009 |
| TW | 201448186 A | | 12/2014 |
| TW | 201947779 A | | 12/2019 |
| TW | 202109858 A | | 3/2021 |
| WO | WO2018078976 A1 | | 5/2018 |
| WO | WO2018043654 A1 | | 8/2018 |
| WO | WO2020175195 A1 | | 9/2020 |

* cited by examiner

IMAGE SENSOR HAVING DISH STRUCTURE FORMED WITHIN MICRO-LENS

BACKGROUND

Technical Field

The present disclosure relates to an image sensor, and it particularly relates to the micro-lens structure of the image sensor.

Description of the Related Art

Image sensors, such as complementary metal oxide semiconductor (CMOS) image sensors (also known as CIS), are widely used in various image-capturing apparatuses such as digital still-image cameras, digital video cameras, and the like. The light-sensing portion of the image sensor may detect ambient color change, and signal electric charges may be generated depending on the amount of light received in the light-sensing portion. In addition, the signal electric charges generated in the light-sensing portion may be transmitted and amplified, whereby an image signal is obtained.

Based on industrial demand, pixel size has continuously been reduced. In order to maintain high levels of performance, a group of pixels (such as the Phase Difference Auto Focus (PDAF) pixels) can be integrated into a conventional sensor array. Light received by the group of pixels may converge through the color filter, to be collected at the corresponding sensing portions at the bottom, and the image focus for the apparatus is detected. However, an image sensor with a reduced pixel size may experience a slight offset in precision, which can significantly affect the overall performance of the device. Therefore, these and related issues need to be addressed through the design and manufacture of the image sensor.

SUMMARY

In an embodiment, an image sensor includes: a plurality of sensing portions; a color filter layer disposed on the sensing portions; and a micro-lens disposed on the color filter layer. The micro-lens includes a positive radius of curvature, and a dish structure including a negative radius of curvature is formed within the micro-lens.

In another embodiment, an image sensor includes: a first group of sensor units; a second group of sensor units, wherein each of the first group of sensor units and the second group of sensor units includes a plurality of sensing portions, a color filter layer disposed on the sensing portions, and a micro-lens disposed on the color filter layer. The micro-lens includes a positive radius of curvature. The image sensor also includes a first dish structure formed within the micro-lens of the first group of sensor units, wherein the first dish structure includes a negative radius of curvature, located at center of the micro-lens of the first group of sensor units. The image sensor further includes a second dish structure formed within the micro-lens of the second group of sensor units, wherein the second dish structure includes the negative radius of curvature, and the second dish structure is offset from center of the micro-lens of the second group of sensor units.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION

Figure 1A:
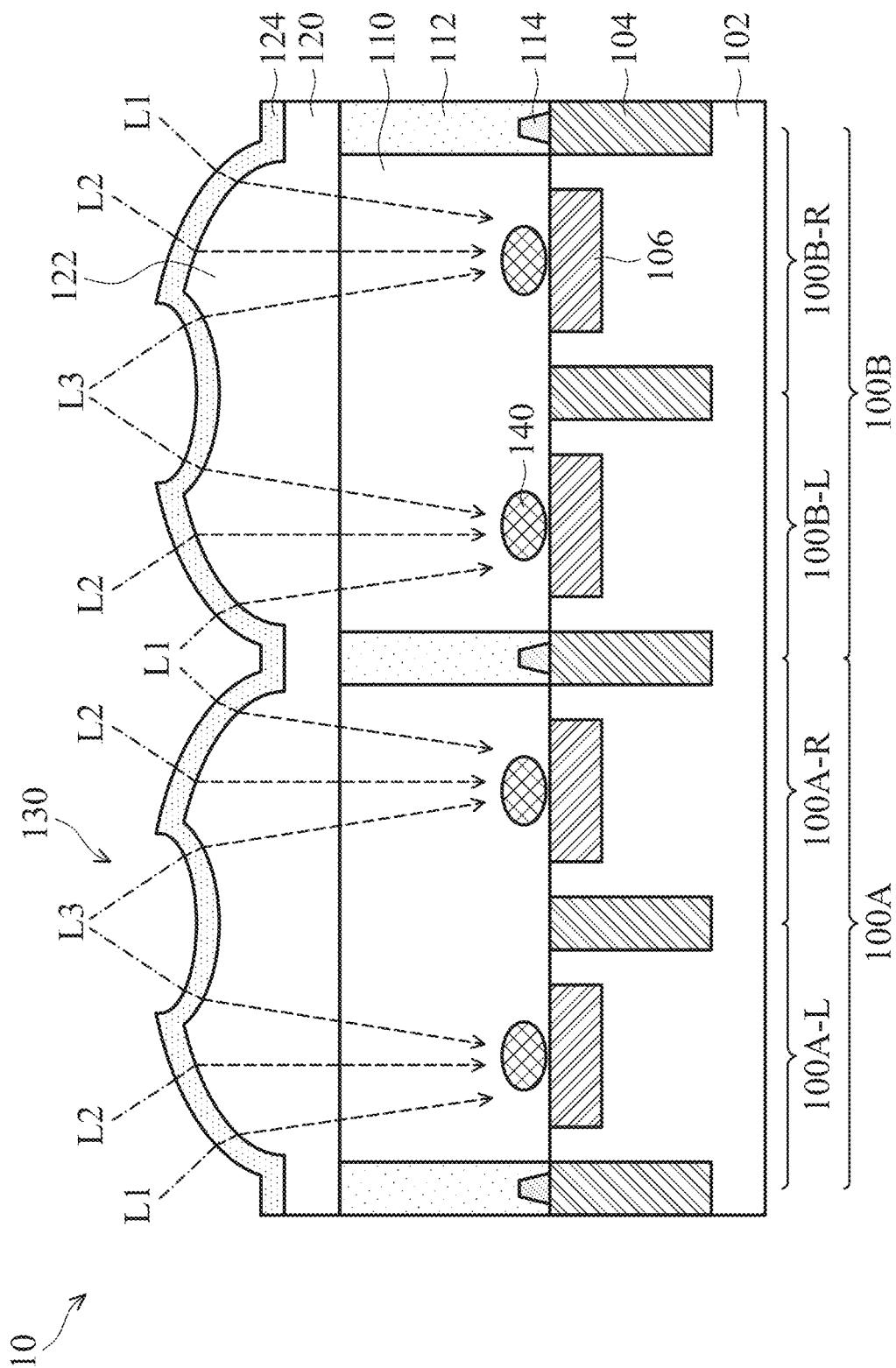
FIGS. 1A-1B are cross-sectional views of an image sensor, according to some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean±20% of the stated value, more typically ±10% of the stated value, more typically ±5% of the stated value, more typically ±3% of the stated value, more typically ±2% of the stated value, more typically ±1% of the stated value and even more typically ±0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the prior art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

In response to the continually reduced pixel size, light reception of each pixel, and light reception uniformity between pixels have become a critical concern. One method of enhancing light reception of smaller pixels among the image sensor is to integrate a group of sensor units (such as Phase Difference Auto Focus (PDAF) pixels). According to some embodiments of the present disclosure, when light is evenly received by each sensor unit within the group, the image sensor can display image of unifying color. However, if light received by each sensor unit is uneven, then the image sensor would experience color variation. While the group of sensor units may detect and track image focus for the overall device, it also allows the determination of color by signals received. Conventionally, there is one single micro-lens disposed above the entire group of sensor units (such as the group of Phase Difference Auto Focus pixels). In other words, all sensor units within a group shares one single micro-lens, while each of the remaining sensor units has one micro-lens disposed on top. The single micro-lens above the group of sensor units may enable light to converge together for tracking and detecting. For example, when light is entered at an inclined angle, one of the sensor units within the group may receive more light than another sensor unit, and thus based on the signal reading between the sensor units, entry light direction may be accurately determined.

Under normal conditions, the single micro-lens above the group of sensor units allows incident light rays to converge at a center point of the group of sensor units to form a light spot, which may be scattered toward surrounding sensing portions for reception. The light spot size depends on the structural characteristics of the micro-lens. For example, a larger light spot may be generated when the micro-lens has a larger radius of curvature, while a smaller light spot may be generated when the micro-lens has a smaller radius of curvature. In the event when process variation occurs, such as an unintentional misalignment of micro-lens structure, the light spot may be shifted away from the center point of the group of sensor units. As a result, the surrounding sensing portions may receive uneven light intensity, which will convert to different signals, causing the color determination to vary.

For example, when one individual sensor unit is selected from each of several groups of sensor units and combined to form a first pixel, the first pixel may display a specific color from accumulating the signals read from each selected sensor units. When another individual sensor unit is selected from each of the same groups of sensor units and combined to form a second pixel, the second pixel may display a specific color from accumulating the signals read from each selected sensor units. Ideally, the first pixel and the second pixel should display the same color. However, if the sensor units within each group receive different light intensity, the signals converted between the sensor units would be significantly different. As a result, there may be a severe color variation between the first pixel and the second pixel, affecting the image displayed.

Also note that, the impact of process variation on display performance may be different between the larger light spot and the smaller light spot. When the light spot is larger, the shifted amount with respect to the total light spot size may be relatively small. In contrast, when the light spot is smaller, the same shifted amount with respect to the total light spot size may then be relatively large. In other words, improving the uniformity of color determination may be achieved by either reducing occurrence of process variation or generating the larger light spot (from micro-lens with the larger radius of curvature). However, reducing process variation requires enhancing manufacturing precision, which demands higher cost. On the other hand, maintaining the larger light spot with micro-lens with the larger radius of curvature may limit the design flexibility of the image sensor device. In view of the above, the present disclosure provides an alternative method that does not require increasing the manufacturing cost or limiting the design flexibility.

According to some embodiments of the present disclosure, an innovative dish structure may be formed within the micro-lens to address the above issues. Incorporating the dish structure of the present disclosure within the micro-lens may disperse the light spot toward the surrounding sensing portions, thereby increasing process variation window without increasing manufacturing cost or limiting design flexibility. Therefore, even in the event of process variation, the signal reading between the sensor units may still be properly used to display image of uniform colors. Furthermore, the present disclosure also includes offsetting the dish structure within the micro-lenses to accommodate different entry angles of incident light rays.

FIG. 1A is a cross-sectional view of an image sensor 10, according to some embodiments of the present disclosure. In some embodiments, image sensors may contain millions of sensor units in reality. For the sake of brevity, FIG. 1A only displays a portion of an actual image sensor. The image sensor 10 shown in FIG. 1A includes two groups of sensor units 100A and 100B disposed adjacent to each other. From a top view of one of the groups of sensor units 100A and 100B (shown in FIG. 1C), each of the groups of sensor units 100A and 100B may include four sensor units arranged in 2×2, but the present disclosure is not limited thereto. For example, the group of sensor units 100A and the group of sensor units 100B may correspond to m×n photoelectric conversion elements, in which m and n are positive integers that can be the same or different, but the present disclosure is not limited thereto. For illustration purpose, the group of sensor units 100A and the group of sensor units 100B both include one left sensor unit and one right sensor units. In particular, the group of sensor units 100A includes a left sensor unit 100A-L and a right sensor unit 100A-R, and the group of sensor units 100B includes a left sensor unit 100B-L and a right sensor unit 100B-R.

Please note that, as shown in FIG. 1A, each of the group of sensor units 100A and the group of sensor units 100B has one micro-lens 122 with a dish structure 130 formed therein. The presence of the dish structure 130 can break a continuous curvature profile that a conventional micro-lens 122 possesses, in which incident lights from every direction may converge into a plurality of light spots 140. According to some embodiments of the present disclosure, the dish structure 130 has a negative radius of curvature, while other portions of the micro-lens 122 have a positive radius of curvature. In some embodiments, surfaces with the positive radius of curvature may converge incident light rays, while surfaces with the negative radius of curvature may diverge incident light rays. Incorporating the dish structure 130 into the micro-lens 122 may cause incident lights to focus onto the plurality of light spots 140. The left sensor unit 100A-L, the right sensor unit 100A-R, the left sensor unit 100B-L, and the right sensor unit 100B-R may each receive a light spot 140. Such modification may increase process variation window by allowing entry light to be evenly distributed on every sensing portion 106 of the image sensor 10.

It should be noted that the sign (positive or negative) with respect to the surface shape of any lens having an aspheric surface of the micro-lens 122 or dish structure 130 of the present disclosure is about an area of the micro-lens 122 or dish structure 130 in the vicinity of the optical axis (paraxial region), unless otherwise noted. The sign with respect to the radius of curvature is provided such that a positive radius of curvature indicates a surface shape that is convex toward the object side, and a negative radius of curvature indicates a surface shape that is convex toward the image side.

Referring to FIG. 1A, each of the group of sensor units 100A and the group of sensor units 100B includes a plurality of sensing portions 106, color filter layer 110, and micro-lenses 122. The plurality of sensing portions 106 may be embedded in a substrate 102. The substrate 102 further includes a plurality of deep trench isolation structures 104 embedded within, wherein the plurality of deep trench isolation structures 104 separate each sensing portion 106, and define the size of each sensor unit. Furthermore, the plurality of deep trench isolation structure 104 may help scattering light spots 140 onto the plurality of sensing portions 106. In some embodiments, the substrate 102 may be a single structure shared by all sensor units of the image sensor 10.

In some embodiments, the substrate 102 may be, for example, a wafer or a chip, but the present disclosure is not limited thereto. In some embodiments, the substrate 102 may be a semiconductor substrate, for example, silicon substrate. Furthermore, in some embodiments, the semiconductor substrate may also be an elemental semiconductor including germanium, a compound semiconductor including gallium nitride (GaN), silicon carbide (SiC), gallium arsenide (GaAs), gallium phosphide (GaP), indium phosphide (InP), indium arsenide (InAs), and/or indium antimonide (InSb), an alloy semiconductor including silicon germanium (SiGe) alloy, gallium arsenide phosphide (GaAsP) alloy, aluminum indium arsenide (AlInAs) alloy, aluminum gallium arsenide (AlGaAs) alloy, gallium indium arsenide (GaInAs) alloy, gallium indium phosphide (GaInP) alloy, and/or gallium indium arsenide phosphide (GaInAsP) alloy, or a combination thereof. In some embodiments, the substrate 102 may be a photoelectric conversion substrate, such as a silicon substrate or an organic photoelectric conversion layer.

In other embodiments, the substrate 102 may also be a semiconductor on insulator (SOI) substrate. The semiconductor on insulator substrate may include a base plate, a buried oxide layer disposed on the base plate, and a semiconductor layer disposed on the buried oxide layer. Furthermore, the substrate 102 may be an N-type or a P-type conductive type.

As mentioned above, the substrate 102 may include a plurality of deep trench isolation structures 104 to define active regions, and to electrically isolate active region elements within or above the substrate 102, but the present disclosure is not limited thereto. As noted, the plurality of deep trench isolation structures 104 may help scattering light spots 140. In some embodiments, the deep trench isolation structures 104 may both reflect and refract incident light rays being focused thereon. In some embodiments, other isolation structures may be applied as an alternative. Shallow trench isolation (STI) structures and local oxidation of silicon (LOCOS) structures are examples of other isolation structures. In some embodiments, the formation of the plurality of deep trench isolation structures 104 may include, for example, forming an insulating layer on the substrate 102, selectively etching the insulating layer and the substrate 102 to form trenches that extend from a top surface of the substrate 102 to a position within the substrate, in which the trenches are located between adjacent sensing portions 106. Next, the formation of the plurality of deep trench isolation structures 104 may include growing rich nitrogen-containing (such as silicon oxynitride) liners along the trenches, followed by filling insulating materials (such as silicon dioxide, silicon nitride, or silicon oxynitride) into the trenches with deposition processes. After that, an annealing process is performed on the insulating materials in the trenches, followed by a planarization process on the substrate 102 to remove excessive insulating materials, so the insulating materials in the trenches are level with the top surface of the substrate 102.

In some embodiments, the substrate 102 may include various P-type doped regions and/or N-type doped regions (not shown) formed by, for example, an ion implantation and/or diffusion process. In some embodiments, transistors, photodiodes, or the like, may be formed at the active regions, defined by the plurality of deep trench isolation structures 104.

As mentioned above, the group of sensor units 100A and the group of sensor units 100B may each include a color filter layer 110 disposed on the substrate 102. In some embodiments, the height of the color filter layer 110 may be between approximately 0.3 µm and 2.0 µm. In a particular embodiment, the height of the color filter layer 110 may be approximately 0.9 µm. In some embodiments, the color filter layer 110 may include multiple units, which may be colored red, green, blue, white, or infrared. Each unit of the color filter layer 110 may corresponds to one respective sensing portion 106 of the image sensor 10, and the color of the unit depends on the requirement of each of the group of sensor units 100A and the group of sensor units 100B. The respective sensing portions 106, such as photodiodes, may convert received light signals into electric signals for each of the group of sensor units 100A and the group of sensor units 100B. In some embodiments, sensor units within the same group may have the same color units. In some embodiments, the group of sensor units 100A and the group of sensor units 100B are separated from each other by the partition grid structure 112, which will be explained in detail later. According to some embodiments of the present disclosure, the color filter layer 110 is deposited on the substrate 102 and in the space defined by the partition grid structure 112. The color filter layer 110 may be formed in sequence by a coating, exposure, and development process at different steps. Alternatively, the color filter layer 110 may be formed by ink-jet printing.

Please refer to FIG. 1A. A partition grid structure 112 is disposed between one or more units of the color filter layer 110. For example, the center line (not shown) of the partition grid structure 112 may define the border of the group of sensor units 100A and the group of sensor units 100B. According to some embodiments of the present disclosure, the partition grid structure 112 may have a lower refractive index than each unit of the color filter layer 110. The refractive index is a characteristic of a substance that changes the speed of light, and is a value obtained by dividing the speed of light in vacuum by the speed of light in the substance. When light travels between two different materials at an angle, its refractive index determines the angle of light transmission (refraction). According to some embodiments of the present disclosure, the refractive index of the partition grid structure 112 is approximately between 1.00 and 1.99. When incident light enters the color filter layer 110, the partition grid structure 112 may isolate light rays within the specific unit to serve as the light-trapping function.

The material of the partition grid structure 112 may include a transparent dielectric material. At first, a partition material layer is coated on the substrate 102. Next, a hard mask layer (not shown) is coated on the partition material layer. In some embodiments, the material of the hard mask layer is a photoresist. A photolithography process is performed on the hard mask layer for patterning. Next, an etching process is performed on the partition material layer by using the patterned hard mask layer. The etching process may be dry etching. After the etching process, a portion of the partition material layer is removed on the substrate 102, and multiple openings are formed therein. As mentioned previously, the openings will subsequently be filled with the color filter layer 110.

Still refer to FIG. 1A. A light shielding structure 114 is disposed on the substrate 102 between the group of sensor units 100A and the group of sensor units 100B. In some embodiments, the light shielding structure 114 is embedded within the partition grid structure 112. In some embodiments, the partition grid structure 112 may be higher than or equal to the light shielding structure 114, depending on the design requirements for image sensors 10. In some embodiments, the light shielding structure 114 spans across the border of the group of sensor units 100A and the group of sensor units 100B. In other words, the light shielding structure 114 is disposed in a way shared by any two adjacent sensor units. The arrangement of the light shielding structure 114 may prevent one of the sensing portions 106 under the corresponding unit of the color filter layer 110 to receive additional light from an adjacent unit of different color, which may affect the accuracy of signals received. In some embodiments of the present disclosure, the height of the light shielding structure 114 may be approximately between 0.005 μm and 2.000 μm. In some embodiments, the material of the light shielding structure 114 may include opaque metals (such as tungsten (W), aluminum (Al)), opaque metal nitride (such as titanium nitride (TiN)), opaque metal oxide (such as titanium oxide (TiO)), other suitable materials, or a combination thereof, but the present disclosure is not limited thereto. The light shielding structure 114 may be formed by depositing a metal layer on the substrate 102 and then patterning the metal layer using photolithography and etching processes, but the present disclosure is not limited thereto.

Still refer to FIG. 1A. A micro-lens material layer 120 is disposed on the color filter layer 110 and the partition grid structure 112. In some embodiments, the material of the micro-lens material layer 120 may be a transparent material. For example, the material may include glass, epoxy resin, silicone resin, polyurethane, any other applicable material, or a combination thereof, but the present disclosure is not limited thereto. According to some embodiments of the present disclosure, a plurality of micro-lenses 122 are disposed on the micro-lens material layer 120. In some embodiments, the plurality of micro-lenses 122 may be formed by patterning a top portion of the micro-lens material layer 120 to correspond to each of the group of sensor units 100A and the group of sensor units 100B. Because the plurality of micro-lenses 122 are formed from the micro-lens material layer 120, the plurality of micro-lenses 122 and the micro-lens material layer 120 share the same material. As stated previously, the conventional micro-lens of continuous curvature profile will lead to a light spot 140 focusing mostly on the center point of the group of sensor units 100A or 100B. Even though the deep trench isolation structure 104 may scatter the light spot 140 toward the surrounding sensing portions 106, the light spot 140 may be scattered unevenly when a process variation occurs. Therefore, the image sensor 10 of the present disclosure is designed to have a dish structure 130 formed within each micro-lens 122. The resulting structure shown in FIG. 1A may enable entry light to converge mostly on every sensing portion 106, therefore allowing image with uniform color to be displayed.

In contrast to the micro-lens 122, the dish structure 130 has an opposite curvature profile. As mentioned previously, the micro-lens 122 generally has the positive radius of curvature for converging light rays, except that the dish structure 130 has the negative radius of curvature for diverging light rays. The non-continuous curvature profile may alter the light ray refractions. As shown in FIG. 1A, incident lights L1 and L2 may be refracted toward the center point of the group of sensor units 100A or 100B, similar to a conventional image sensor. However, when an incident light L3 is transmitted through the dish structure 130, it is being refracted away from the center point of the group of sensor units 100A or 100B. Please note that a conventional micro-lens without a dish structure may reflect the incident light L3 away from the micro-lens surface due to its undesirable entry angle, instead of transmitting the incident light L3 into the sensor units. It has been found that breaking the continuous curvature profile of the micro-lens 122 may disperse the conventional light spot focusing at the center point of the group of sensor units 100A and 100B. Combining the converging incident lights L1 and L2 and the diverging incident light L3, the plurality of light spots 140 may be generated on the plurality of sensing portions 106 of the left sensor unit 100A-L, the right sensor unit 100A-R, the left sensor unit 100B-L, and the right sensor unit 100B-R for reception. As will be described in detail later, the plurality of light spots 140 are in fact a torus shape in each of the groups of sensor units 100A and 100B from a top view (shown in FIG. 1C), with hollow center resulted from incorporating the dish structure 130 into the micro-lens 122.

Please refer to FIG. 1A. A top film 124 may be conformally deposited onto the surface of the plurality of micro-lenses 122 and within the dish structure 130. In some embodiments, the top film 124 is a continuous structure that covers the entire surface of the image sensor 10. According to some embodiments of the present disclosure, the material of the top film 124 has a lower refractive index than that of the micro-lenses 122 (or the micro-lens material layer 120). The refractive index of the material of the top film 124 is higher than that of air. In some embodiments, there is a large difference between the refractive index of air and the refractive index of the micro-lenses 122. The large difference between refractive indices may cause some incident light rays to reflect away from the surface of the micro-lenses 122, instead of refract into the color filter layer 110. This will cause the image sensor 10 to lose optical energy, decreasing the amount of light intensity that the plurality of sensing portions 106 would have received. The addition of the top film 124 may serve as a buffer between the large refractive difference between ambient air and the micro-lenses 122, so the optical energy lost may be minimized. In some embodiments, the top film 124 may be a transparent material including, for example, a glass, epoxy resin, silicone resin, polyurethane, other suitable materials, or a combination thereof, but the present disclosure is not limited thereto. The formation of the top film 124 may include deposition processes, which may include, for example, spin-on coating process, chemical vapor deposition (CVD), physical vapor deposition (PVD), atomic layer deposition (ALD), other suitable methods, or a combination thereof.

In a specific embodiment, a group of sensor units having the dish structure formed within the micro-lens is being compared with another group of sensor units not having the dish structure formed within the micro-lens. The ratio of light intensity received between the left sensor unit 100A-L and the right sensor unit 100A-R, or between the left sensor unit 100B-L and the right sensor unit 100B-R is measured. The measurement is carried out under several conditions where the micro-lens is being intentionally shifted, which is similar to what may happen in the event of process variation. The measurement data is summarized in Table 1.

TABLE 1

| Micro-lens | Conventional Design | | | | New Design | | | |
| --- | --- | --- | --- | --- | --- | --- | --- | --- |
| Shift | R | Gr | Gb | B | R | Gr | Gb | B |
| 0 nm | 1.07 | 0.98 | 1.02 | 0.94 | 1.05 | 0.98 | 1.01 | 0.94 |
| 10 nm | 1.11 | 1.02 | 1.07 | 1.01 | 1.08 | 1.02 | 1.05 | 1.01 |
| 20 nm | 1.16 | 1.07 | 1.12 | 1.08 | 1.10 | 1.06 | 1.09 | 1.09 |
| 30 nm | 1.21 | 1.12 | 1.17 | 1.15 | 1.13 | 1.11 | 1.13 | 1.17 |
| 40 nm | 1.26 | 1.17 | 1.23 | 1.23 | 1.16 | 1.15 | 1.17 | 1.26 |
| 50 nm | 1.31 | 1.22 | 1.28 | 1.32 | 1.19 | 1.19 | 1.20 | 1.35 |

In an ideal situation, the left sensor unit 100A-L and the right sensor unit 100A-R, or the left sensor unit 100B-L and the right sensor unit 100B-R should receive the same amount of light intensity. In other words, the ratio of light intensity received between the left sensor unit 100A-L and the right sensor unit 100A-R, or between the left sensor unit 100B-L and the right sensor unit 100B-R should have the value of 1. However, process variation degrades the uniformity of light received between sensor units, causing the ratio value to deviate from 1. It should be appreciated that the ratio value is expected to be as close to 1 as possible, a significantly large variation may compromise the color display. In Table 1, the comparison between the conventional design (micro-lens without dish structure) and the new design (micro-lens with dish structure) is presented. Measurements are performed in different wavelength ranges (or different color units), in which "R" is the red color unit, "B" is the blue color unit, "Gr" is the green color unit adjacent to the red color unit in a horizontal direction, and "Gb" is the green color unit adjacent to the blue color unit in a horizontal direction. Additionally, these measurements are also performed under a micro-lens shift of 0 nm (no shifting), 10 nm, 20 nm, 30 nm, 40 nm, and 50 nm. It can be seen from Table 1 that there is no significant change between the two designs when the micro-lens shift is 0 nm (no shifting). As shifting occurs, ratio values from the conventional design in average become significantly greater than ratio values from the new design. Therefore, the design of the present disclosure can bring the ratio values closer to 1, thereby improving the uniformity of color determination.

As shown in FIG. 1A, according to some embodiments, an image sensor includes: a plurality of groups of sensor units 100A/100B, wherein each of the groups of sensor units includes a plurality of sensing portions 106, a color filter layer 110 disposed on the sensing portions 106, and a micro-lens 122 disposed on the color filter layer 110. The micro-lens 122 includes a positive radius of curvature, and a dish structure 130 including a negative radius of curvature is formed within the micro-lens 122.

Figure 1B:
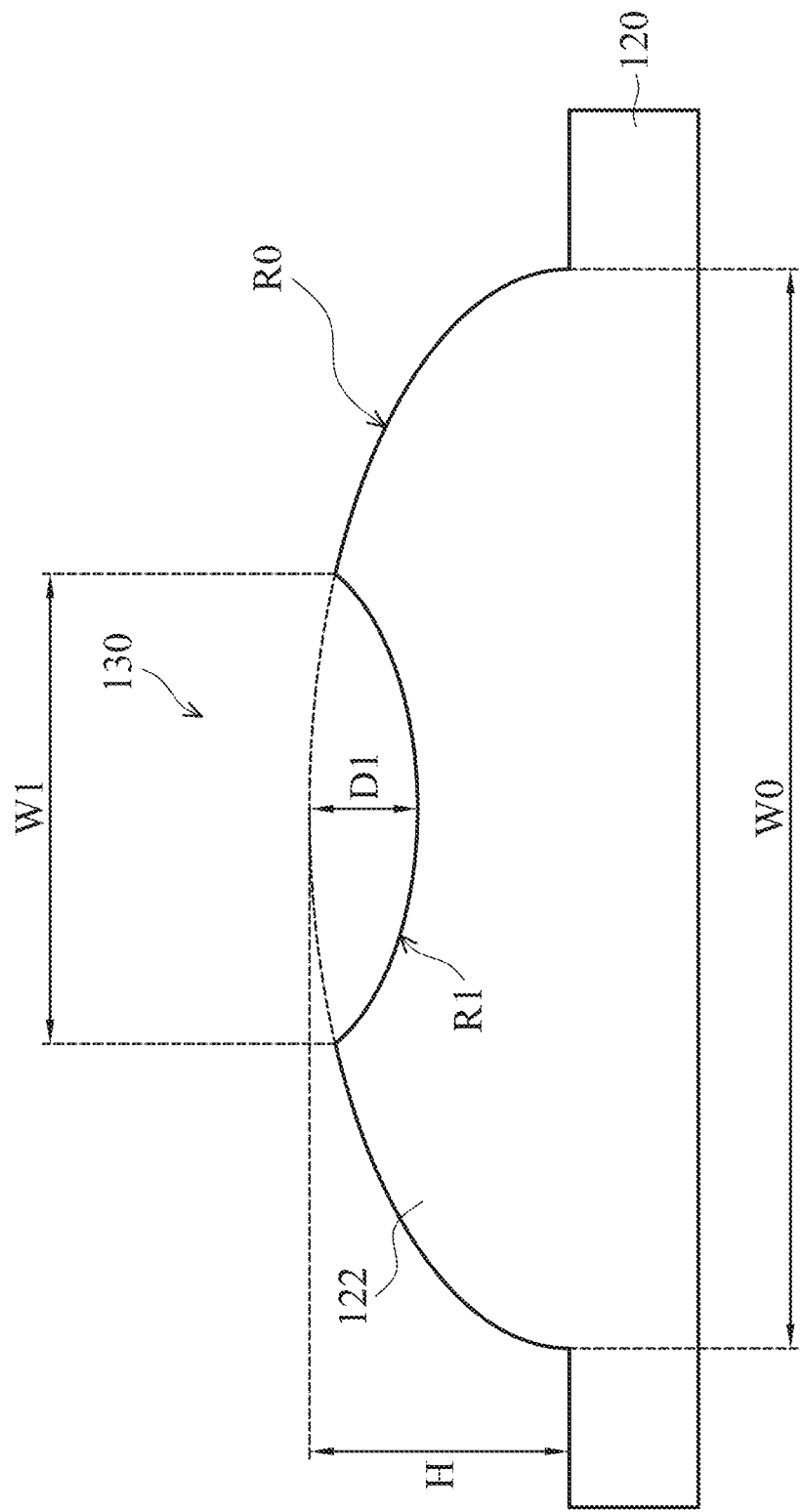

FIG. 1B is a cross-sectional view of the image sensor 10, according to some embodiments of the present disclosure. Specifically, FIG. 1B illustrates an enlarged view of the micro-lens 122 and the dish structure 130 of the image sensor 10 from FIG. 1A. According to some embodiments of the present disclosure, the dish structure 130 is located at the center of the micro-lens 122, and the process of fabricating such dish structure 130 within the micro-lens 122 will be described in detail later. As stated previously, the micro-lens 122 generally has the positive radius of curvature, except that the dish structure 130 has the negative radius of curvature. In terms of magnitude, a radius of curvature R0 of the micro-lens 122 is larger than a radius of curvature R1 of the dish structure 130. In some embodiments, a first depth D1 (maximum depth) of the dish structure 130 is approximately between 25% and 50% of a height H of the micro-lens 122. A first width W1 of the dish structure 130 is approximately between 20% and 60% of a bottom width W0 of the micro-lens 122.

Figure 1C:
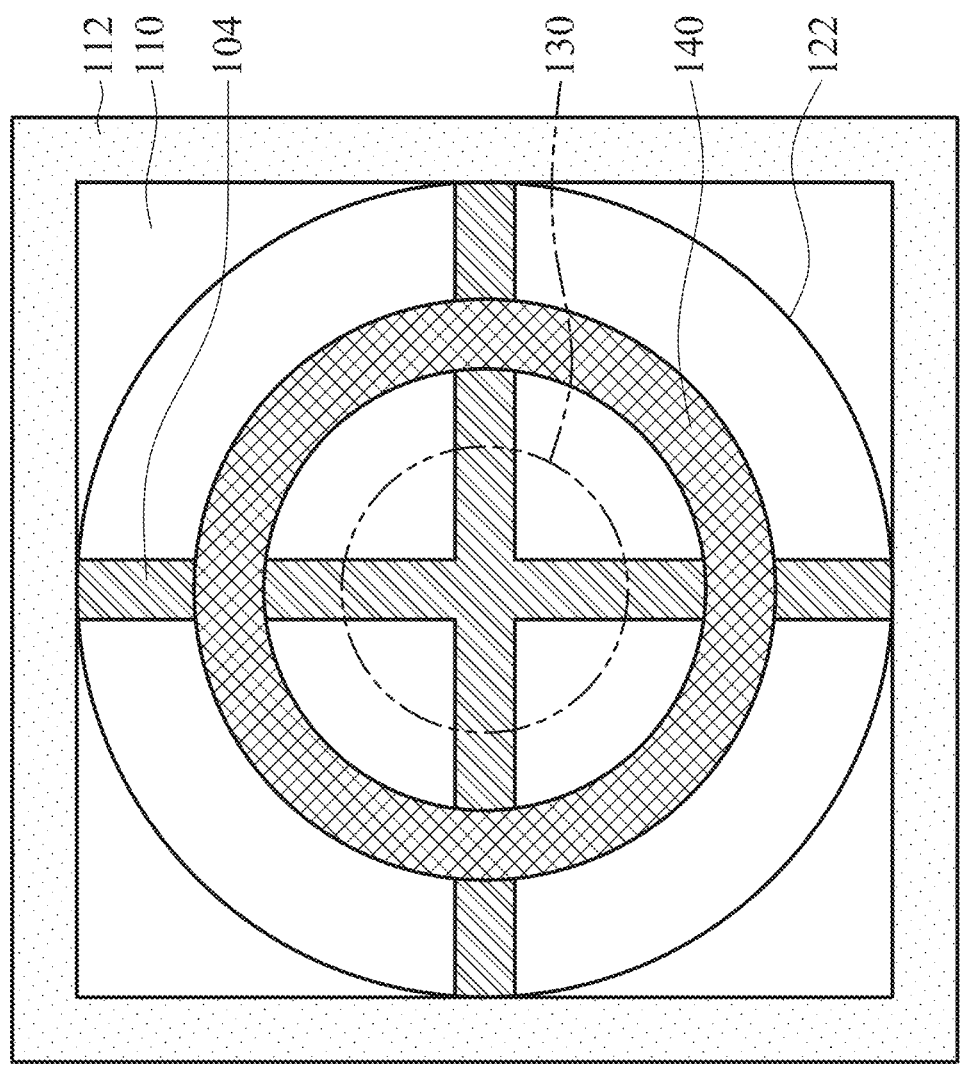
FIG. 1C is a top view of the image sensor, according to some embodiments of the present disclosure.

FIG. 1C is a top view of the image sensor 10, according to some embodiments of the present disclosure. As mentioned, each of the group of sensor units 100A or 100B may include four sensor units arranged in 2×2. The group of sensor units 100A or 100B includes the partition grid structure 112 surrounding its periphery. The deep trench isolation structure 104 may be disposed under the partition grid structure 112 (not shown), and may be further disposed in a way that separates and defines the sensor units, which are arranged in 2×2. The color filter layer 110 may fill the opening inside the partition grid structure 112. The micro-lens 122 is disposed on the color filter layer 110, and a dish structure 130 is formed within the micro-lens 122, located at the center of the micro-lens 122. Conventional micro-lens 122 (without the dish structure 130) will gather incident light rays to focus on the center point of the group of sensor units 100A or 100B. As stated previously, the presence of the dish structure 130 breaks the continuous curvature profile of the micro-lens 122, dispersing the light spot 140 into a torus shape, leaving the center hollow. The torus-shape light spot 140 allows each sensing portion 106 (not shown) to more effectively detect optical signals and determine their respective color. Even in the event of process variation, color determination from the sensing portions 106 may have significantly less interference.

Figure 2A:
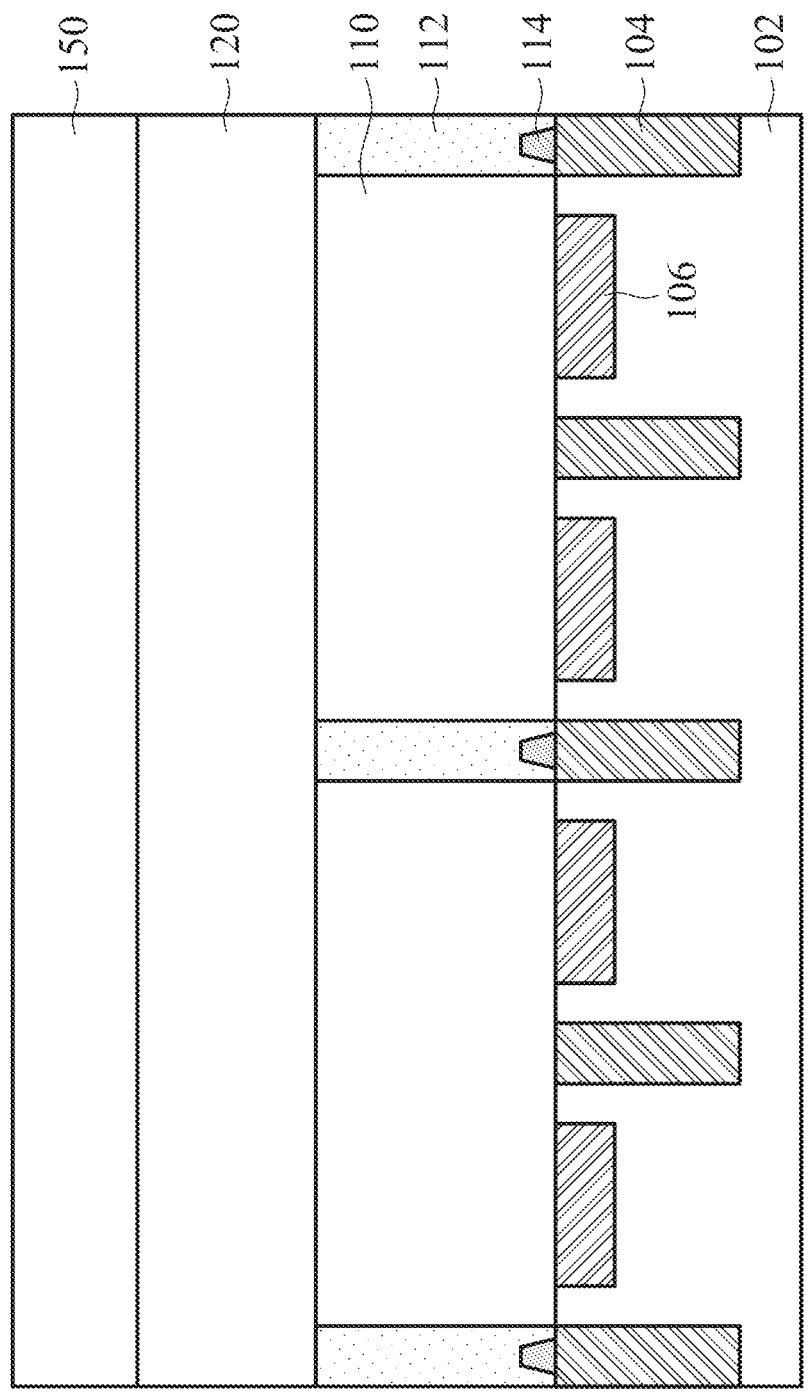
FIGS. 2A-2D are cross-sectional views of the image sensor at various intermediate fabrication stages, according to some embodiments of the present disclosure.
Figure 2B:
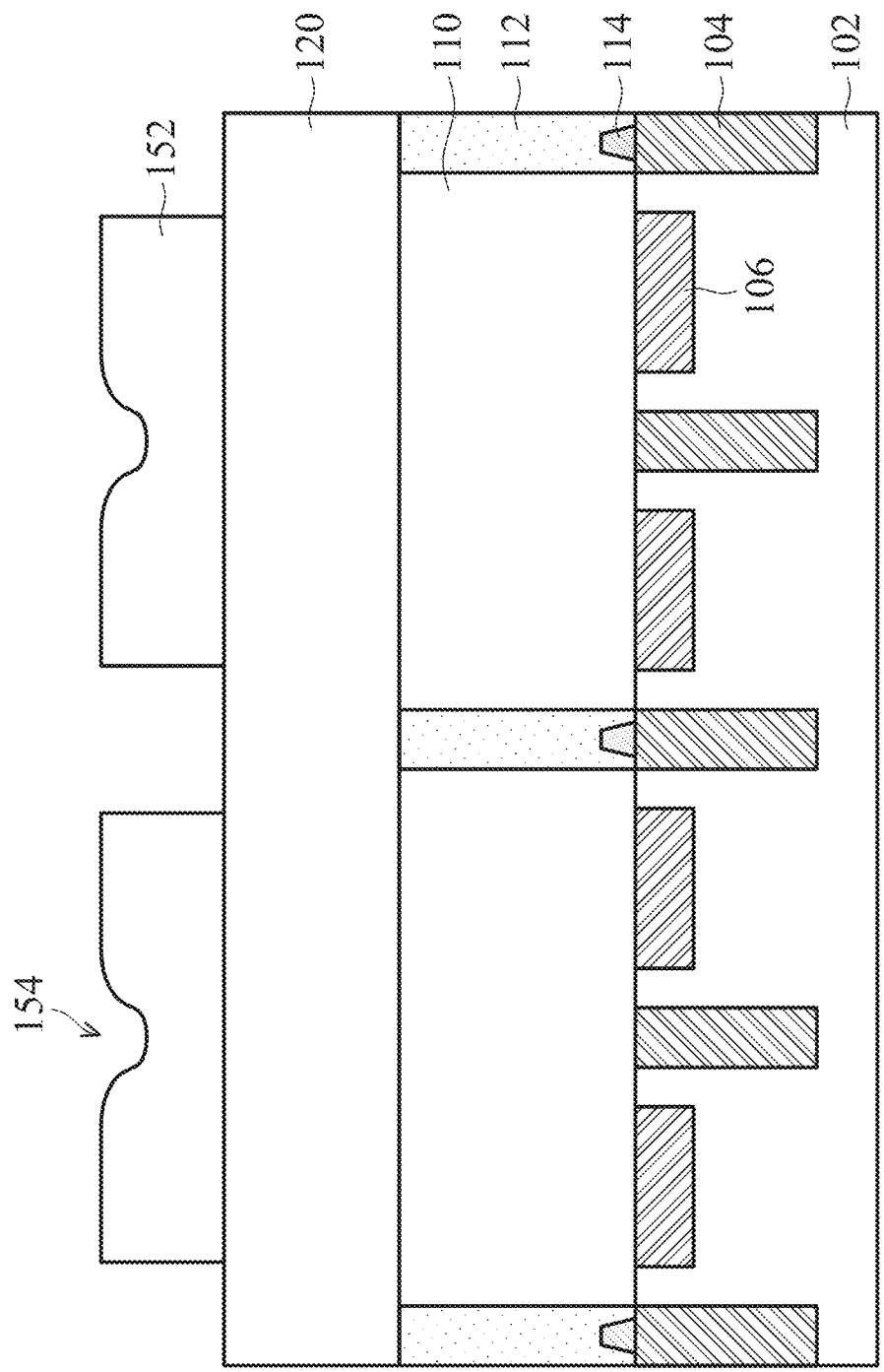
Figure 2C:
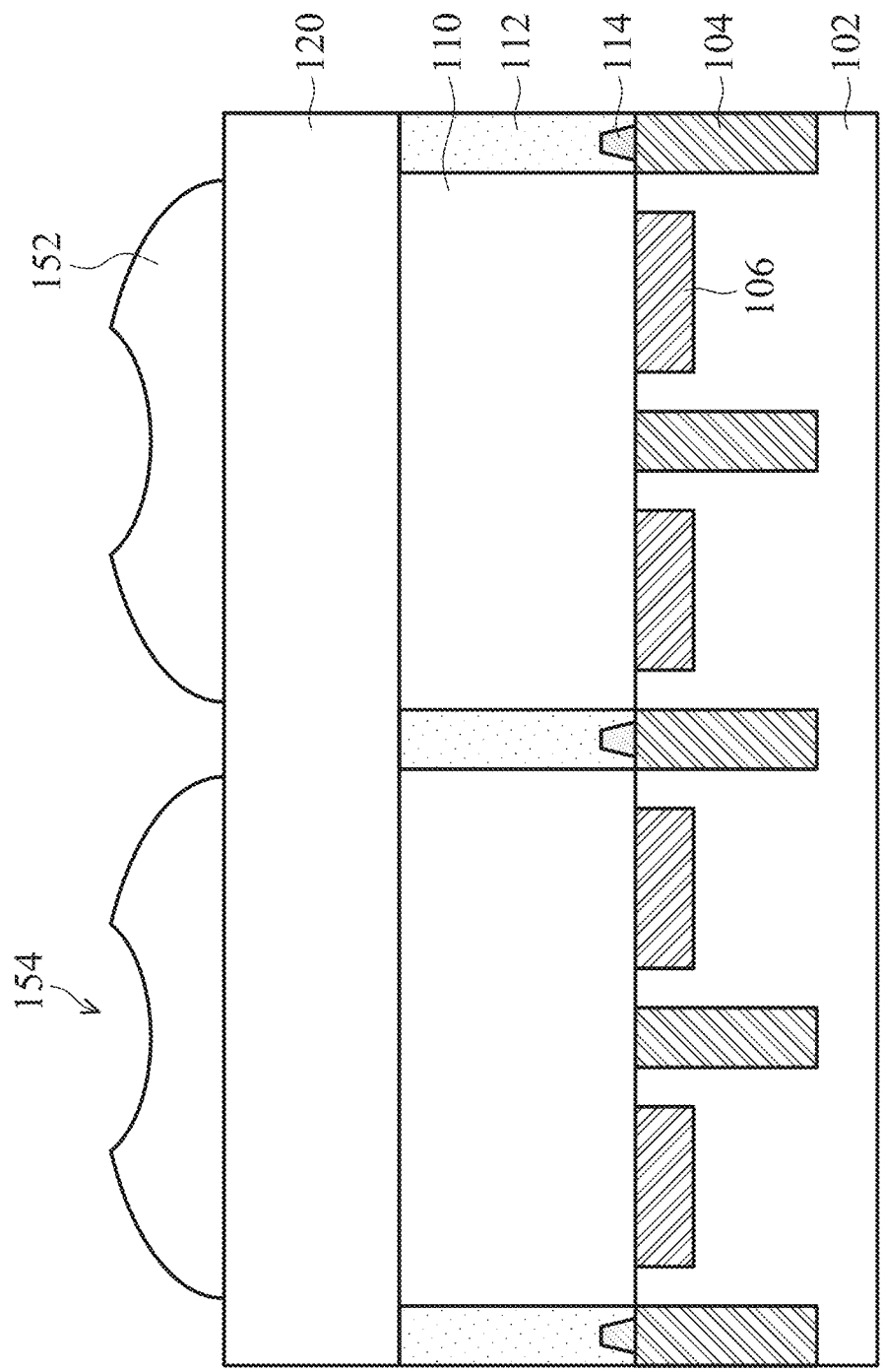
Figure 2D:
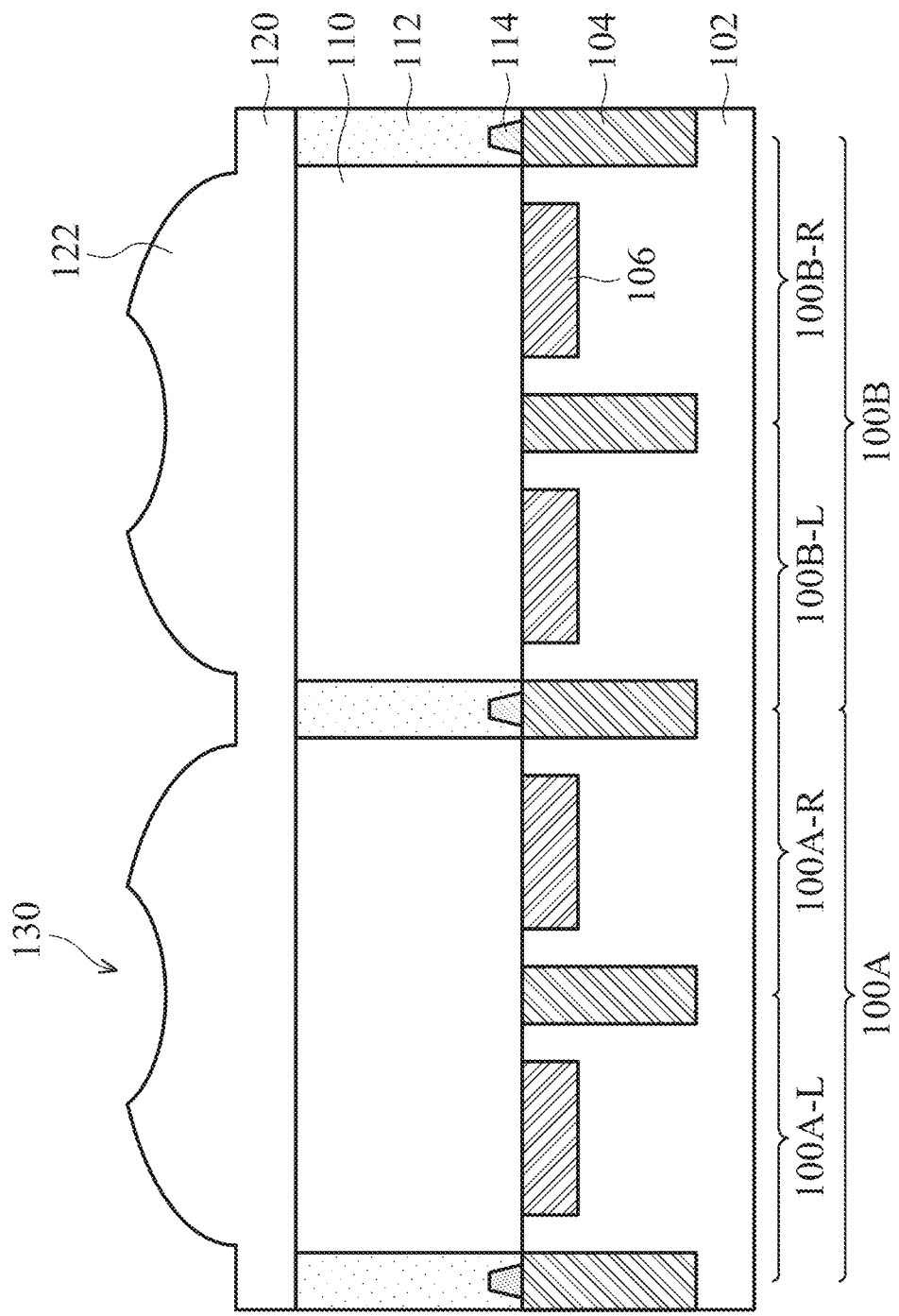

FIGS. 2A-2D are cross-sectional views of the image sensor 10 at various intermediate fabrication stages, according to some embodiments of the present disclosure. As shown in FIG. 2A, a hard mask layer 150 is first formed above the micro-lens material layer 120. In some embodiments, the hard mask layer 150 includes any resin-containing materials, or a combination thereof. In some embodiments, the hard mask layer 150 may have a thickness smaller than that of the micro-lens material layer 120. Through a photolithography patterning and etching, the hard mask layer 150 may form into a hard mask pattern 152, as shown in FIG. 2B. According to some embodiments of the present disclosure, the hard mask pattern 152 are rectangular shapes each having a cavity 154 thereon. A reflow process is performed to turn the hard mask pattern 152 into dome shapes, each having a reflowed cavity 154 thereon, as shown in FIG. 2C. Through a dry etching process, the shape of the hard mask pattern 152 is completely transferred to the top portion of the micro-lens material layer 120, as shown in FIG. 2D. After the dry etching processes, the top portion of the micro-lens material layer 120 may result in the plurality of micro-lenses 122 each having the dish structure 130, while the bottom portion of the micro-lens material layer 120 may serve as a base for the micro-lenses 122.

Figure 3:
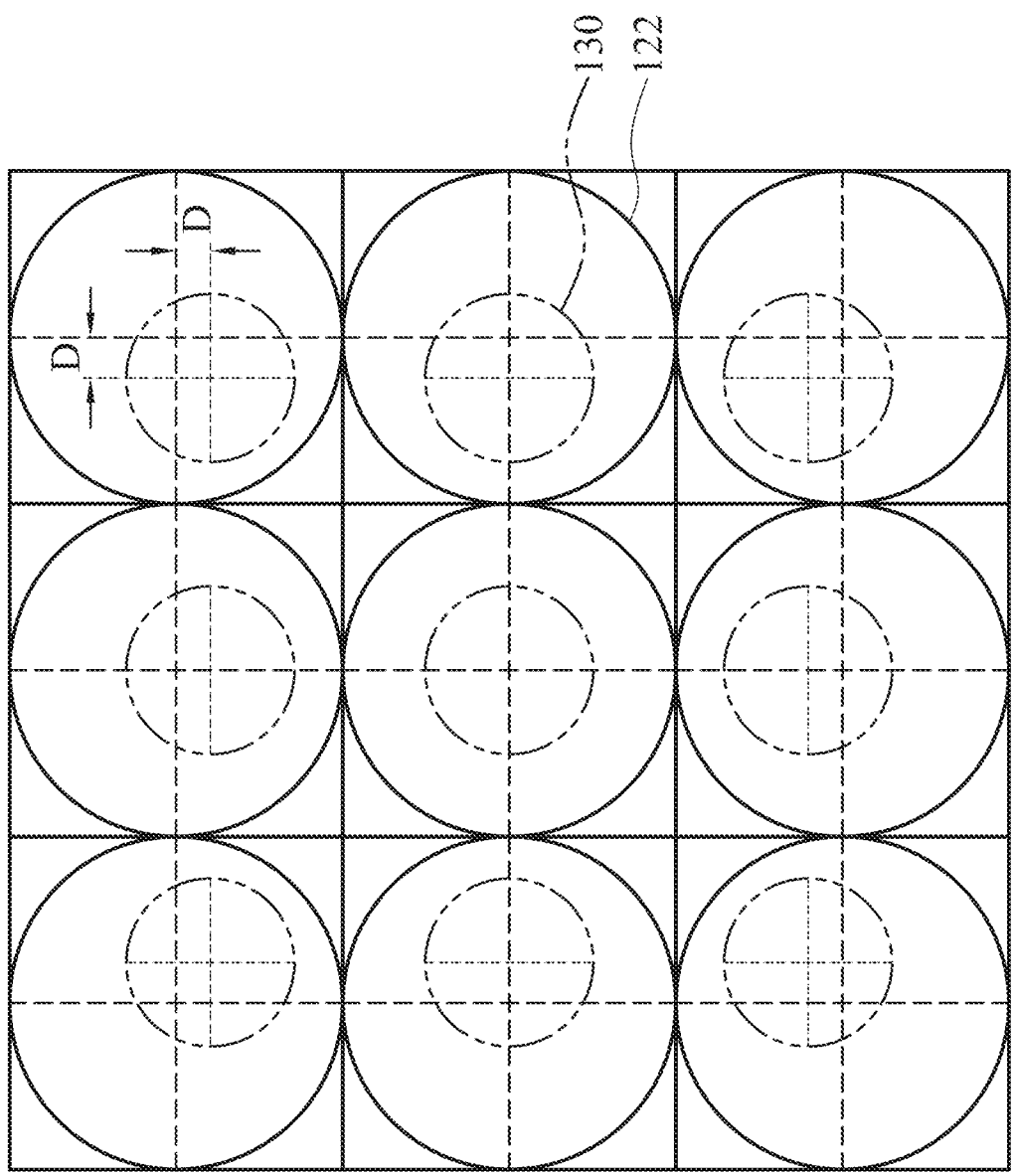
FIG. 3 is a top view of an image sensor array, according to other embodiments of the present disclosure.

FIG. 3 is a top view of an image sensor array, according to other embodiments of the present disclosure. It should be understood that the image sensor array shown is illustrative, and it is not intended to be limiting. When a light source emits light rays onto the image sensor array, the light source is typically placed at a position normal to a center-most group of sensor units, in which incident light rays are received at a direction normal to the array plane. The remaining groups of sensor units surrounding the center-most group of sensor units may only receive incident light rays at an inclined direction with respect to the array plane. The inclined incident light rays may converge at a location that shifts away from the center point of the surrounding groups of sensor units. In order to compensate the light spots that shift away from the center point, the micro-lenses 122 disposed on the surrounding groups of sensor units may be intentionally shifted toward the center-most group of sensor units. Since the shifted amount of the micro-lenses 122 of the surrounding groups of sensor units are minimal, it is not specifically illustrated in FIG. 3. However, the dish structures 130 within the micro-lenses 122 of the surrounding groups of sensor units may also be shifted accordingly.

Please refer to FIG. 3. The dish structure 130 within the center-most group of sensor units remains at the center of its corresponding micro-lens. However, the dish structures 130 within the surrounding groups of sensor units are all shifted from the center of their correspondingly micro-lenses toward the center-most group of sensor units. Depending on the position of the dish structures 130 with respect to the center-most group of sensor units, the dish structures 130 may be shifted horizontally, vertically, or both horizontally and vertically (such as diagonally) toward the center-most group of sensor units. Please note that, the shifted amount of the micro-lenses 122 and the dish structures 130 may vary depending on how far they are from the center-most group of sensor units. For example, the dish structures 130 and/or the micro-lenses 122 may be intentionally shifted by a lesser amount when they are closer to the center-most group of sensor units, and by a larger amount when they are further away from the center-most group of sensor units. According to some embodiments of the present disclosure, the dish structures 130 may be offset from the center of their corresponding micro-lenses 122 by a distance D, in which the distance D is approximately between 0% and 35% of the pixel size from center. Depending on the arrangement of the image sensor array and the light ray emission, the micro-lenses 122 and the dish structures 130 may be shifted by an equal amount or by a different amount.

Figure 4A:
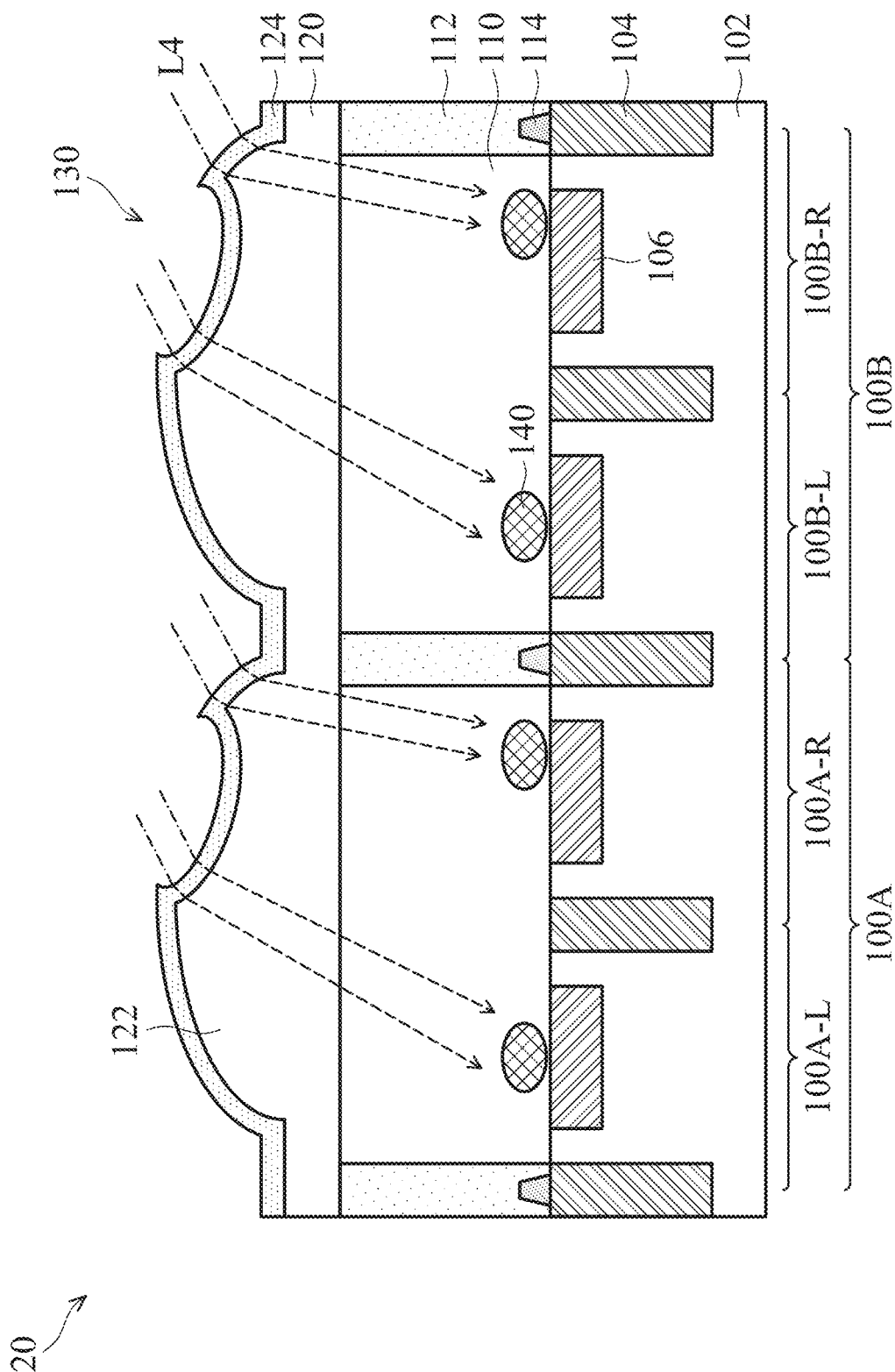
FIGS. 4A-4B are cross-sectional views of another image sensor, according to yet other embodiments of the present disclosure.

FIG. 4A is a cross-sectional view of another image sensor 20, according to some other embodiments of the present disclosure. The image sensor 20 illustrates what a surrounding group of sensor units from FIG. 3 may appear to be. In comparison with the image sensor 10 shown in FIG. 1A, the dish structures 130 formed within the micro-lenses 122 of the groups of sensor units 100A and 100B are offset from the center of their corresponding micro-lenses 122. Please also note that in addition, the micro-lenses 122 of the groups of sensor units 100A and 100B are also shifted slightly toward the right. The features of the substrate 102, the plurality of deep trench isolation structures 104, the plurality of sensing portions 106, the color filter layer 110, the partition grid structure 112, and the light shielding structure 114 of the image sensor 20 are similar to those of the image sensor 10, and the details are not described again herein to avoid repetition.

Please refer to FIG. 4A. When the groups of sensor units 100A and 100B are positioned away from the center of the image sensor array (for example, toward the edge), only incident lights L4 of a specific inclined angle may be received. When the incident lights L4 are transmitted through the micro-lenses 122 of the positive radius of curvature, the incident lights L4 converge into the light spots 140 formed on the sensing portions 106 of the right sensor unit 100A-R and the right sensor unit 100B-R for reception. On the other hand, when the incident lights L4 are transmitted through the dish structures 130 of the negative radius of curvature, the incident lights L4 diverge away from the center points of the groups of sensor units 100A and 100B to form the light spots 140 on the sensing portions 106 of the left sensor unit 100A-L and the left sensor unit 100B-L for reception. If the dish structures 130 were to be remained at the center of their corresponding micro-lenses 122, the incident lights L4 may not be properly received by the left sensor unit 100A-L and the left sensor unit 100B-L. In fact, maintaining the dish structures 130 at the center of their corresponding micro-lenses 122 may deflect some of the incident lights L4 away from the sensing portions 106 of the left sensor unit 100A-L and the left sensor unit 100B-L. Therefore, the design of the present disclosure can also accommodate inclined incident light rays, thereby improving the uniformity of color determination.

As shown in FIGS. 1A and 4A, according to some embodiments, an image sensor includes: a first group of sensor units; a second group of sensor units, wherein each of the first group of sensor units and the second group of sensor units includes a plurality of sensing portions 106, a color filter layer 110 disposed on the sensing portions 106, and a micro-lens 122 disposed on the color filter layer 110. The micro-lens 122 includes the positive radius of curvature. The image sensor also includes a first dish structure formed within the micro-lens 122 of the first group of sensor units, wherein the first dish structure includes a negative radius of curvature, located at center of the micro-lens 122 of the first group of sensor units. The image sensor further includes a second dish structure formed within the micro-lens 122 of the second group of sensor units, wherein the second dish structure includes the negative radius of curvature, and the second dish structure is offset from center of the micro-lens 122 of the second group of sensor units.

Figure 4B:
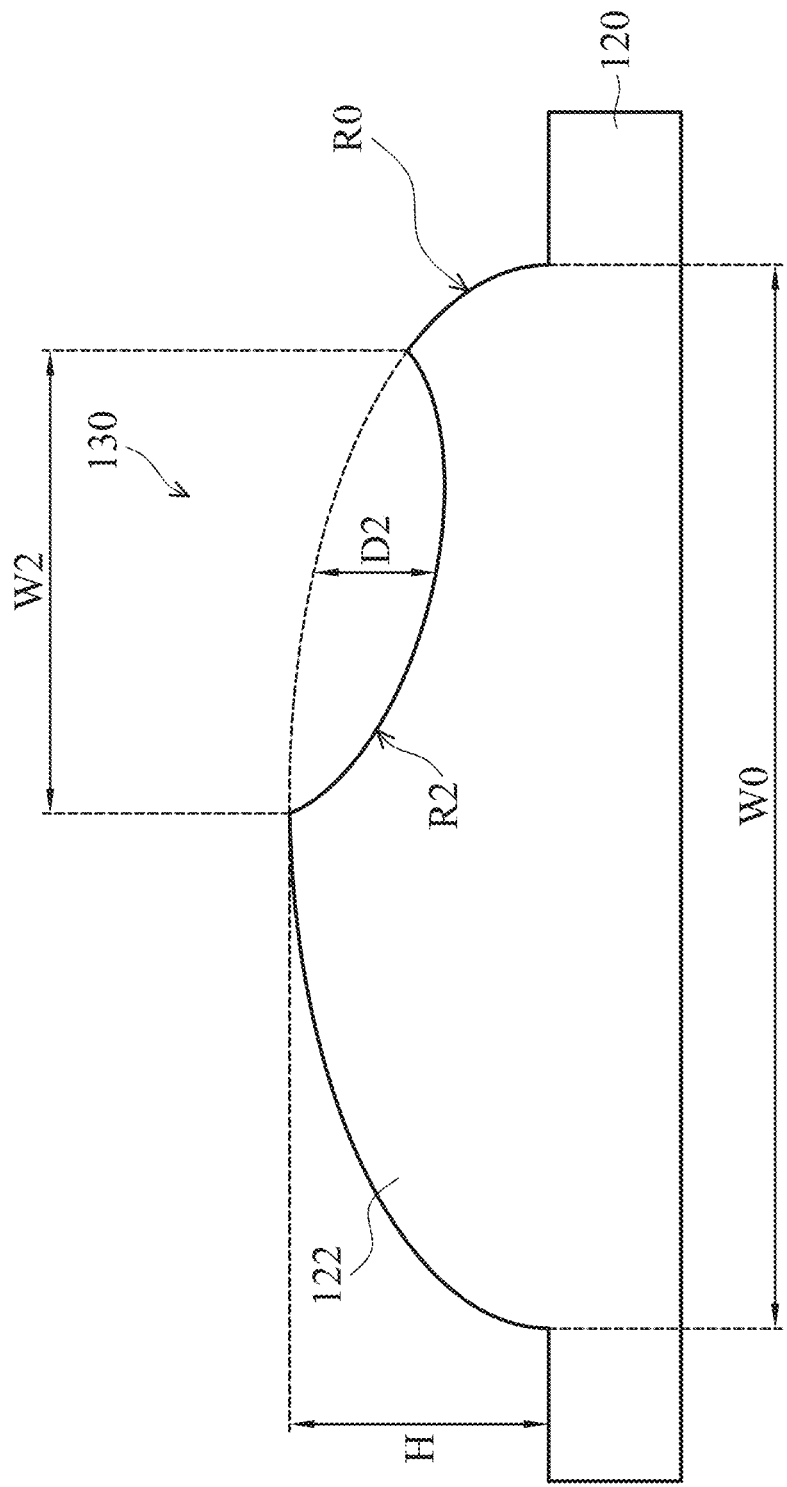

FIG. 4B is a cross-sectional view of the image sensor 20, according to some embodiments of the present disclosure. Specifically, FIG. 4B illustrates an enlarged view of the micro-lens 122 and the dish structure 130 of the image sensor 20 from FIG. 4A. According to some embodiments of the present disclosure, the dish structure 130 is offset from the center of the micro-lens 122. As stated previously, the micro-lens 122 generally has the positive radius of curvature, except that the dish structure 130 has the negative radius of curvature. In terms of magnitude, the radius of curvature R0 of the micro-lens 122 is larger than a radius of curvature R2 of the dish structure 130. In some embodiments, a second depth D2 (maximum depth) of the dish structure 130 is approximately between 20% and 40% of the height H of the micro-lens 122. A second width W2 of the dish structure 130 is approximately between 20% and 60% of the bottom width W0 of the micro-lens 122.

Still refer to FIG. 4B. In comparison with FIG. 1B, the radius of curvature R1 of the dish structure 130 located at the center of the micro-lens 122 and the radius of curvature R2 of the dish structure 130 offset from the center of the micro-lens 122 may be the same. In other embodiments, the radius of curvature R1 and the radius of curvature R2 may be different. Furthermore, depending on the design requirements, the first depth D1 and the first width W1 may be the same as the second depth D2 and the second width W2, respectively. In other cases, the first depth D1 and the first width W1 may be different from the second depth D2 and the second width W2, respectively. The dimensions of the dish structures 130 shown in FIG. 1B and FIG. 4B may be designed to allow incident light rays from every direction to be properly focused into the light spots 140 on every sensing portion 106 for reception, which in turn improves the uniformity of color determination.

The foregoing outlines features of several embodiments so that those skilled in the art will better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the prior art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. An image sensor, comprising:
a plurality of sensing portions;
a color filter layer disposed on the sensing portions;
a micro-lens disposed on the color filter layer, wherein the micro-lens comprises a positive radius of curvature, and a dish structure comprising a negative radius of curvature is formed within the micro-lens, wherein the dish structure corresponds to two or more of the sensing portions, wherein a bottom of the dish structure is above half of a height of the micro-lens; and
a micro-lens base disposed between the color filter layer and the micro-lens, wherein the micro-lens base has a planar top surface spanning across and extending beyond the micro-lens.

2. The image sensor of claim 1, wherein the plurality of sensing portions are embedded within a substrate.

3. The image sensor of claim 2, wherein the substrate further comprises a plurality of deep trench isolation (DTI) structures separating the plurality of sensing portions.

4. The image sensor of claim 1, further comprising a partition grid structure within the color filter layer.

5. The image sensor of claim 4, further comprising a light shielding structure embedded within the partition grid structure.

6. The image sensor of claim 1, further comprising a top film disposed conformally on the micro-lenses and within the dish structure.

7. The image sensor of claim 6, wherein a refractive index of the top film is lower than a refractive index of the micro-lens.

8. The image sensor of claim 6, wherein the refractive index of the top film is higher than a refractive index of air.

9. The image sensor of claim 1, wherein a radius of curvature of the micro-lens is different from a radius of curvature of the dish structure.

10. The image sensor of claim 1, wherein the dish structure is disposed at a center of the micro-lens.

11. The image sensor of claim 1, wherein the dish structure comprises a first depth, wherein the first depth is less than a height of the micro-lens.

12. The image sensor of claim 1, wherein the dish structure comprises a first width, wherein the first width is less than a bottom width of the micro-lens.

13. An image sensor, comprising:
a first group of sensor units;
a second group of sensor units,
wherein each of the first group of sensor units and the second group of sensor units comprises a plurality of sensing portions, a color filter layer disposed on the sensing portions, and a micro-lens disposed on the color filter layer;
wherein the micro-lens comprises a positive radius of curvature;
wherein a first dish structure is formed within the micro-lens of the first group of sensor units, wherein the first dish structure comprises a negative radius of curvature, located at a center of the micro-lens of the first group of sensor units; and
wherein a second dish structure is formed within the micro-lens of the second group of sensor units, wherein the second dish structure comprises the negative radius of curvature, and the second dish structure is offset from a center of the micro-lens of the second group of sensor units.

14. The image sensor of claim 13, wherein a radius of curvature of the micro-lens is different from a radius of curvature of the first dish structure, and the radius of curvature of the micro-lens is different from a radius of curvature of the second dish structure.

15. The image sensor of claim 14, wherein the first dish structure and the second dish structure have a same radius of curvature.

16. The image sensor of claim 14, wherein the first dish structure and the second dish structure have different radii of curvature.

17. The image sensor of claim 13, wherein the second dish structure is offset from the center of the micro-lens of the second group of sensor units horizontally, vertically, or diagonally from a top view.

18. The image sensor of claim 13, further comprising a top film disposed conformally on the micro-lenses and within the first dish structure or the second dish structure.

19. The image sensor of claim 18, wherein a refractive index of the top film is lower than a refractive index of the micro-lens.

20. The image sensor of claim 18, wherein the refractive index of the top film is higher than a refractive index of air.

* * * * *